United States Patent
An (10) Patent No.: US 10,916,612 B2
(45) Date of Patent: Feb. 9, 2021

(54) PIXEL UNIT AND ARRAY SUBSTRATE COMPRISING THE SAME

(71) Applicant: Shenzhen China Star Optoelectronics Technology Co., Ltd., Guangdong (CN)

(72) Inventor: Liyang An, Guangdong (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 631 days.

(21) Appl. No.: 15/539,819

(22) PCT Filed: May 25, 2017

(86) PCT No.: PCT/CN2017/085838
§ 371 (c)(1),
(2) Date: Jun. 26, 2017

(87) PCT Pub. No.: WO2018/205311
PCT Pub. Date: Nov. 15, 2018

(65) Prior Publication Data
US 2019/0393296 A1    Dec. 26, 2019

(30) Foreign Application Priority Data

May 9, 2017 (CN) .......................... 2017 1 0319935

(51) Int. Cl.
*H01L 27/32* (2006.01)
*H01L 27/12* (2006.01)
(52) U.S. Cl.
CPC ........ *H01L 27/3265* (2013.01); *H01L 27/124* (2013.01)

(58) Field of Classification Search
CPC .......................... H01L 27/124; H01L 27/3265
See application file for complete search history.

(56) References Cited

U.S. PATENT DOCUMENTS

2014/0313466 A1* 10/2014 Cheng ............... G02F 1/136213
349/139

FOREIGN PATENT DOCUMENTS

CN        1959508 A        5/2007
CN        1959984 A        5/2007
(Continued)

OTHER PUBLICATIONS

International Search Report and Written Opinion for International Application No. PCT/CN2017/085838, dated May 25, 2017.
(Continued)

*Primary Examiner* — Amar Movva (57) ABSTRACT

The technical field of liquid crystal display is related to. A pixel unit is provided. The pixel unit includes a storage capacitor that is arranged on an array substrate. The storage capacitor includes a first electrode arranged on a first metal layer and a second electrode arranged on a second metal layer. An insulation layer is arranged between the first electrode and the second electrode. The second electrode and the first electrode overlap with each other to form a first overlapping region, an area of which does not change if a deviation of the second electrode relative to the first electrode is within a preset distance. Storage capacitor difference among different pixel units generated by alignment accuracy difference thereof can be eliminated, and watermark which would be generated otherwise can be eliminated as well. An array substrate is further provided, which includes the storage capacitor of the aforesaid pixel unit. A quality of a product can be improved.

11 Claims, 7 Drawing Sheets

(56) References Cited

FOREIGN PATENT DOCUMENTS

| CN | 201000520 Y | 1/2008 |
| CN | 101750826 A | 6/2010 |
| CN | 102054832 A | 5/2011 |
| CN | 102544110 A | 7/2012 |

OTHER PUBLICATIONS

Chinese Office Action and Search Report for Chinese Patent Application No. 201710319935.X, dated Oct. 23, 2018.

* cited by examiner

Fig. 1

Prior Art

PIXEL UNIT AND ARRAY SUBSTRATE COMPRISING THE SAME

CROSS REFERENCE TO RELATED APPLICATION

The present application claims priority of Chinese patent application CN201710319935.X, entitled "Pixel Unit and Array Substrate Comprising the Same" and filed on May 9, 2017, the entirety of which is incorporated herein by reference.

FIELD OF THE INVENTION

The present disclosure relates to the technical field of liquid crystal display, and particularly to a pixel unit and an array substrate comprising the same.

BACKGROUND OF THE INVENTION

Watermark defect is a commonly seen problem in a liquid crystal display panel. In general, non-uniform images, such as raindrop-shaped defect, cluster-shaped defect, and fog-shaped defect are all called as watermark defect. There are many reasons for the watermark defect, such as non-uniform gap of a liquid crystal cell, non-uniform etching of metal, and alignment accuracy difference among different regions of the panel. The alignment accuracy difference among different regions of the panel will result in inconsistent storage capacitors of pixel units in different regions of the panel, and thus watermark will be generated.

Figure 1:
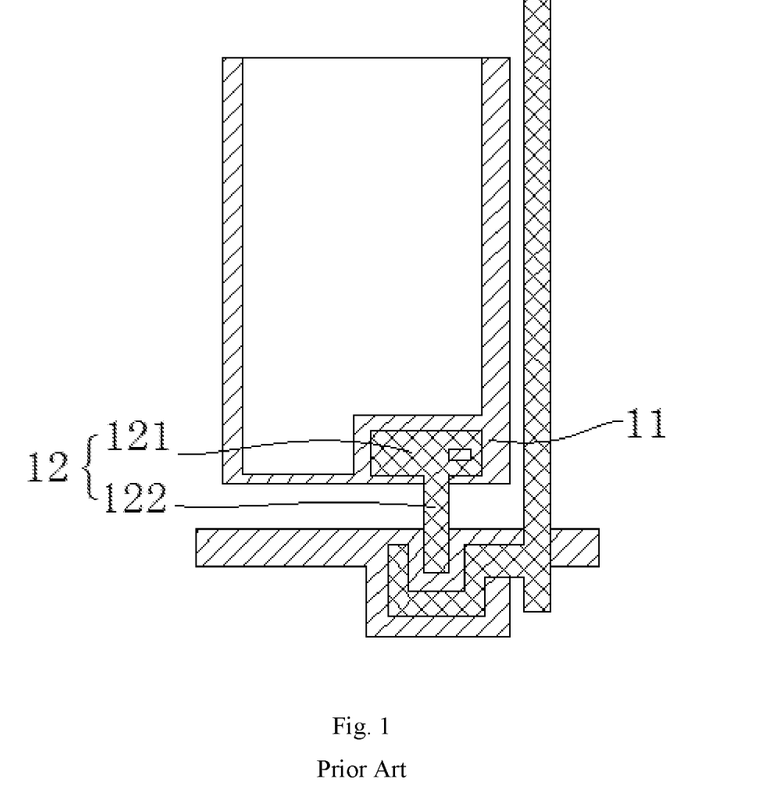
FIG. 1 schematically shows a commonly seen small sized pixel in the prior art.

The storage capacitor of the pixel unit plays an important role during image display process of the liquid crystal display panel. A feedthrough effect can be reduced by the storage capacitor effectively, and a voltage applied to liquid crystal molecules can be maintained. Therefore, a more stable image can be displayed by the pixel unit. If a charging rate permits, the storage capacitor should be arranged as large as possible during design process, so that the image displayed therein is more uniform and more stable. FIG. 1 schematically shows a commonly seen small sized pixel in the prior art. A storage capacitor comprises a first electrode 11 arranged on a first metal layer and a second electrode 12 arranged on a second metal layer. The second electrode 12 comprises a second region 121 and a third region 122 connected to a drain electrode. Meanwhile, an insulation layer is arranged between the first electrode 11 and the second electrode 12. A value of the storage capacitor depends on an area of an overlapping region between the second electrode 12 and the first electrode 11. As shown in FIG. 1, the overlapping region between the second electrode 12 and the first electrode 11 is constituted by an overlapping region between the second region 121 and the first electrode 11 and an overlapping region between the third region 122 and the first electrode 11. In conventional design, when observing along a normal line direction of an array substrate, an area of the second region 121 is smaller than an area of the first electrode 11. That is, a peripheral edge of the first electrode 11 deviates outwards for at least 2.5 μm relative to a peripheral edge of the second region 121. In this arrangement, the characteristics of the following manufacturing procedures with a photomask and an influence of alignment accuracy are taken into consideration.

Figure 2A:
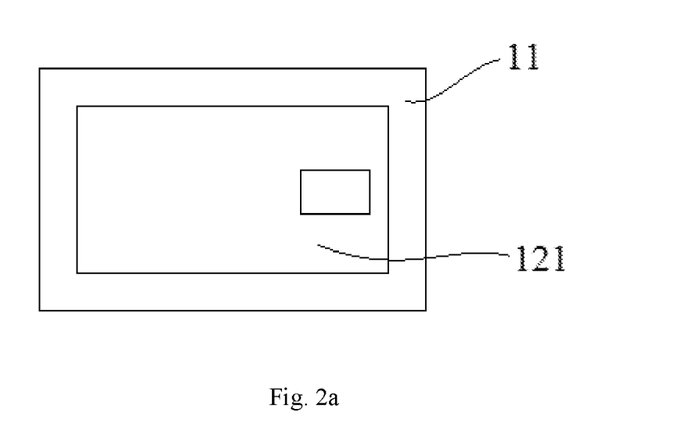
FIGS. 2a, 2b, and 2c show changing of an overlapping region between a second electrode and a first electrode when the second electrode faces directly to, moves downwards, and moves upwards respectively relative to the first electrode in a product with a large sized pixel unit when a connecting line between the second electrode and a drain electrode is ignored.
Figure 2B:
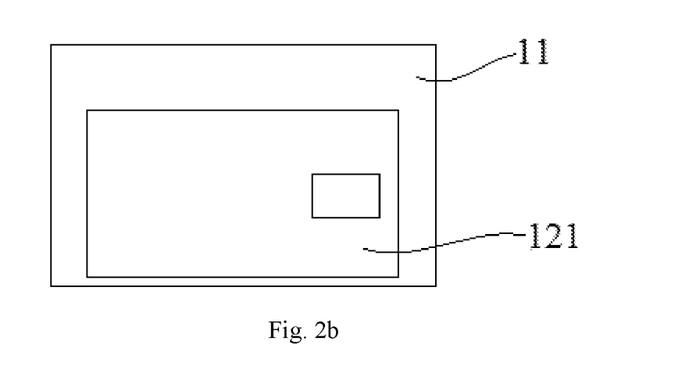
Figure 2C:
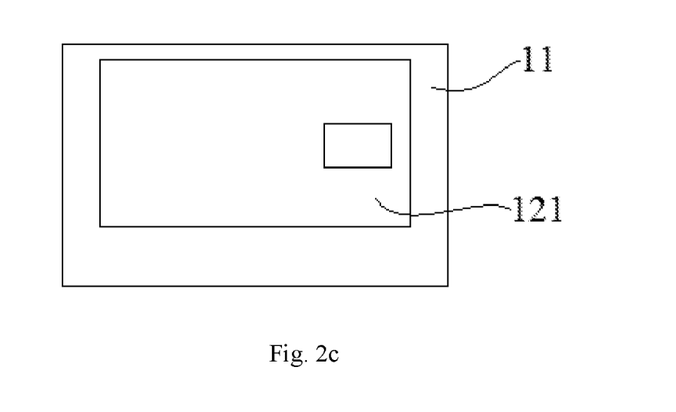

During a manufacturing procedure of the array substrate, the alignment accuracy difference among different regions thereof will result in deviation of the second electrode of the storage capacitor of pixel units in different regions from the first electrode, and a deviation amount does not exceed 2.5 μm. When the storage capacitor as shown in FIG. 1 is used, an overlapping region between the third region 122 and the first electrode 11 can be ignored with respect to a product with a large sized pixel unit. That is, the overlapping region between the second electrode 12 and the first electrode 11 is constituted by the overlapping region between the second region 121 and the first electrode 11. In this manner, even if the second electrode deviates relative to the first electrode, the area of the overlapping region between the second electrode 12 and the first electrode 11 does not change, and the value of the storage capacitor does not change. FIGS. 2a, 2b, and 2c show positional relationships between the second electrode 12 and the first electrode 11 when the second electrode 12 faces directly to, moves downwards, and moves upwards respectively relative to the first electrode 11. It can be seen that, no matter the second electrode moves downwards or upwards relative to the first electrode, the area of the overlapping region between the second electrode 12 and the first electrode 11 does not change. That is, the value of the storage capacitor does not change. In this manner, the watermark generated by the changing of the storage capacitor can be avoided.

Figure 3A:
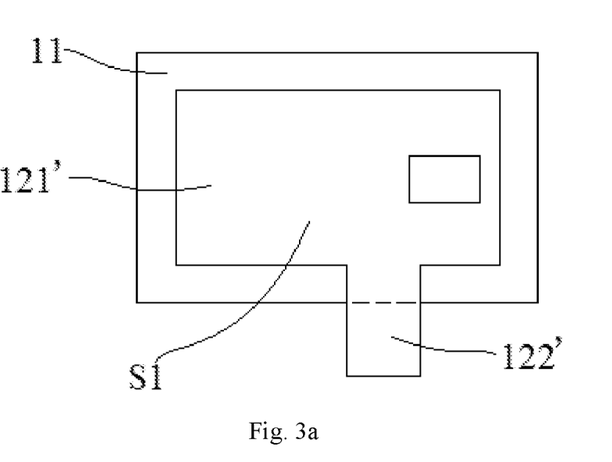
FIGS. 3a, 3b, and 3c show changing of an overlapping region between a second electrode and a first electrode when the second electrode faces directly to, moves downwards, and moves upwards respectively relative to the first electrode in a product with a small sized pixel unit when a connecting line between the second electrode and a drain electrode cannot be ignored.
Figure 3B:
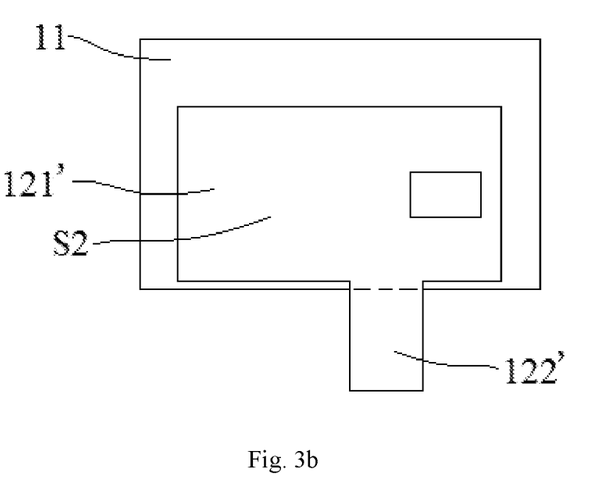
Figure 3C:
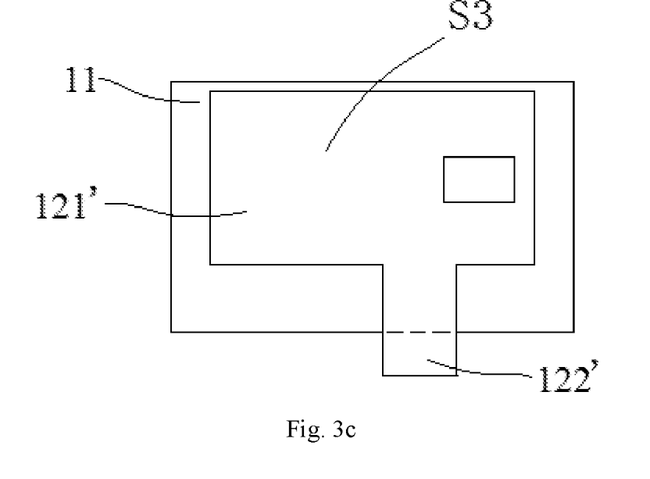

However, with respect to a product with a small sized pixel unit, an overlapping region between a third region 122' and the first electrode 11 cannot be ignored. At this time, when the second electrode 12' deviates relative to the first electrode 11, an area of an overlapping region between the second electrode 12' and the first electrode 11 will change, as shown in FIGS. 3a, 3b, and 3c. FIG. 3a schematically shows the second electrode 12' and the first electrode 11 in normal positions, and the area of the overlapping region therebetween is S1 at this time. When the second electrode 12' moves downwards relative to the first electrode 11, the area of the overlapping region therebetween is S2. It is obvious that, S2 is smaller than S1, as shown in FIG. 3b. When the second electrode 12' moves upwards relative to the first electrode 11, the area of the overlapping region therebetween is S3. It is obvious that, S3 is larger than S1, as shown in FIG. 3c. The difference between the areas of the overlapping regions will result in changing of the storage capacitor. The changing of the storage capacitor has a relatively little influence on the product with a large sized pixel unit, while has a great influence on the product with a small sized pixel unit. This is because that, the small sized pixel unit has a relatively small storage capacitor, but a wire width of the drain electrode of the small sized pixel unit is basically the same as that of the large sized pixel unit. Therefore, the changing of the storage capacitor resulted from deviation between the first electrode and the second electrode thereof has a greater influence on the small sized pixel unit. The alignment accuracy difference among different regions will result in difference among storage capacitors in different regions. The watermark defect will be generated by the difference among storage capacitors during low gray-scale display, and consequently, display quality of the product will be adversely affected.

SUMMARY OF THE INVENTION

Aiming at the technical defect in the prior art, the present disclosure provides a pixel unit. Through arranging a structure of a first electrode and a second electrode of a storage capacitor, storage capacitors of different pixel units can be maintained consistent with one another when an alignment accuracy between the first electrode and the second electrode in one pixel unit is different from that in another pixel unit. In this manner, the watermark resulted from storage capacitor difference can be avoided.

A pixel unit, which comprises a storage capacitor that is arranged on an array substrate, wherein the storage capacitor comprises a first electrode arranged on a first metal layer and a second electrode arranged on a second metal layer;

wherein an insulation layer is arranged between the first electrode and the second electrode; and wherein the second electrode and the first electrode overlap with each other to form a first overlapping region, an area of which does not change if a deviation of the second electrode relative to the first electrode is within a preset distance.

A value of the storage capacitor depends on the area of the overlapping region between the second electrode and the first electrode. Therefore, when the area of the overlapping region can be maintained unchanged, the value of the storage capacitor can also be maintained unchanged. In this manner, the watermark resulted from storage capacitor difference among different pixel units can be avoided, and a quality of a product can be improved.

As an improvement on the present disclosure, in the aforesaid pixel unit, the first electrode comprises a first region, and the second electrode comprises a second region and a third region. When a center of the second region and a center of the first region coincide with each other, a peripheral edge of the first region deviates a first distance to an outside part of the second region relative to a peripheral edge of the second region. The third region is arranged at a first edge of the second region and extends to the outside part of the second region along a second direction, and the third region has a first width along a first direction. The first direction is perpendicular to the second direction, and the preset distance is equal to the first distance.

Here, the first distance can be arranged as a maximum alignment accuracy error. Therefore, during alignment procedure, the second region is always inside the first region, and changing of the area of the first overlapping region generated by movement of the second region can be avoided.

As a further improvement on the present disclosure, in the aforesaid pixel unit, the second electrode further comprises a fourth region which is arranged at a second edge of the second region and extends to the outside part of the second region along the second direction. A width of the fourth region along the first direction is equal to the first width, and the second edge is parallel to the first edge.

Since the third region extends to the outside part of the second region along the second direction, the third region protrudes to an outside part of the first region. When an alignment accuracy between the first electrode and the second electrode in one pixel unit is different from that in another pixel unit, an overlapping area between the third region and the first region will change. As a result, the area of the first overlapping region of one pixel unit will be different from that of another pixel unit, and the storage capacitor of one pixel unit will be different from that of another pixel unit accordingly. That is, the watermark will be generated. Similarly, there is also an overlapping area between the fourth region and the first region. When the alignment accuracy between the first electrode and the second electrode in one pixel unit is different from that in another pixel unit, the overlapping area between the fourth region and the first region will also change. When the fourth region is arranged on an opposite side of the third region, the changing of the overlapping area between the third region and the first region can be offset by the changing of the overlapping area between the fourth region and the first region. In particular, when the width of the fourth region along the first direction is equal to the width of the third region along the first direction, the changing of the overlapping area between the third region and the first region can be better offset by the changing of the overlapping area between the fourth region and the first region. Therefore, the difference among areas of the first overlapping regions of different pixel units can be reduced, and the difference among storage capacitors thereof can be reduced accordingly. In this manner, the watermark generated by the first electrode and the second electrode alignment accuracy difference among different pixel units can be eliminated.

As a further improvement on the fourth region, in the aforesaid pixel unit, the fourth region is arranged opposite to the third region. At this time, a central line of the fourth region along the second direction and a central line of the third region along the second direction coincide with each other. In this manner, no matter the peripheral edges of the first region and the second region have what kind of shape, the changing of the overlapping area between the third region and the first region can be offset by the changing of the overlapping area between the fourth region and the first region to a largest extent, and thus the watermark generated by the first electrode and the second electrode alignment accuracy difference among different pixel units can be eliminated.

As a further improvement on the fourth region, in the aforesaid pixel unit, a length of the fourth region along the second direction is equal to or larger than twice the first distance. With this arrangement, when the alignment accuracy between the first electrode and the second electrode in one pixel unit is different from that in another pixel unit, the changing of the overlapping area between the third region and the first region can be completely offset by the changing of the overlapping area between the fourth region and the first region. Therefore, different pixel units can have a consistent area of the first overlapping region and a consistent storage capacitor, and thus the watermark which would be generated otherwise can be avoided.

In the aforesaid pixel unit, the first electrode further comprises a blank region which is arranged at a third edge of the first region and extends to an inside part of the first region along the second direction. The third edge is arranged parallel to and opposite to the first edge.

Since no metal is arranged in the blank region, the overlapping area between the second region and the first region is not equal to the area of the second region any more, but equal to a value obtained by subtracting an overlapping area between the blank region and the second region from the area of the second region. In order to facilitate the illustration of the technical solution, it is assumed that the overlapping area between the blank region and the second region is a blank overlapping area, and an overlapping area between the third region and the first region is a second overlapping area. Then, the area of the first overlapping region is a value obtained by subtracting the blank overlapping area from a sum of the area of the second region and the second overlapping area. When the blank region is arranged at the third edge which is opposite to the first edge, i.e., the blank overlapping area is arranged on an opposite side of the second overlapping area, changing of the second overlapping area can be offset by changing of the blank overlapping area, and the difference among areas of the first overlapping regions in different pixel units can be reduced. Therefore, the watermark generated by the first electrode and the second electrode alignment accuracy difference among different pixel units can be eliminated.

As a further improvement on the blank region, in the aforesaid pixel unit, a central line of the blank region along the second direction and a central line of the third region along the second direction coincide with each other. That is, the blank region and the third region are both arranged on a same central line along the second direction. In this manner, no matter the peripheral edges of the first region and the second region have what kind of shape, the changing of the overlapping area between the third region and the first region can be offset by the changing of the overlapping area between the blank region and the second region to a largest extent, and thus the watermark generated by the first electrode and the second electrode alignment accuracy difference among different pixel units can be eliminated.

As a further improvement on the blank region, in the aforesaid pixel unit, a length of the blank region along the second direction is equal to or larger than twice the first distance. With this arrangement, when the alignment accuracy between the first electrode and the second electrode in one pixel unit is different from that in another pixel unit, the changing of the overlapping area between the third region and the first region can be completely offset by the changing of the overlapping area between the blank region and the second region. Therefore, different pixel units can have a consistent area of the first overlapping region and a consistent storage capacitor, and thus the watermark which would be generated otherwise can be avoided.

In the aforesaid pixel unit, the first direction is a direction of the first edge, and the second direction is a deviation direction of the second electrode relative to the first electrode.

The present disclosure further provides an array substrate, which comprises the aforesaid pixel unit. In the array substrate, when the alignment accuracy between the first electrode and the second electrode in one pixel unit is different from that in another pixel unit, different pixel units can have a consistent area of the first overlapping region. Therefore, the watermark which would be generated otherwise can be avoided, and the quality of the product can be improved.

In a word, with respect to the storage capacitor in the pixel unit disclosed herein, through arranging the fourth region or the blank region, the changing of the overlapping area between the third region and the first region can be offset. Therefore, the difference among the areas of the first overlapping regions of different pixel units can be reduced, and the difference among the storage capacitors thereof can be reduced accordingly. In this manner, the watermark generated by the first electrode and the second electrode alignment accuracy difference among different pixel units can be eliminated, and the quality of the product can be improved. At the same time, a quality of the array substrate which comprises the storage capacitor can be improved.

The above technical features can be combined in any suitable manner, or substituted by the equivalent technical features, as long as the purpose of the present disclosure can be achieved.

BRIEF DESCRIPTION OF THE DRAWINGS

The present disclosure will be illustrated in detail hereinafter with reference to the embodiments and the accompanying drawings. In the drawings.

In the drawings, the same components are represented by the same reference signs, and the size of each component does not represent the actual size of the corresponding component.

DETAILED DESCRIPTION OF THE EMBODIMENTS

The details of the present disclosure can be understood more clearly combining the description on the drawings and the embodiments. However, the specific embodiments disclosed herein are only used for illustrating the present disclosure, while cannot be understood as limiting the present disclosure in any manner. Those skilled in the art can make any deformations under the teaching of the technical content disclosed herein, and all the deformations fall into the scope of the present disclosure. The present disclosure will be further illustrated hereinafter with reference to the drawings.

The present disclosure will be described in detail hereinafter with reference to the accompanying drawings. The terms "upper", "lower", "right", and "left" in the following text are directions relative to the directions shown in the drawings, and should not be construed as limiting the scope of the disclosure.

Embodiment 1

Figure 4A:
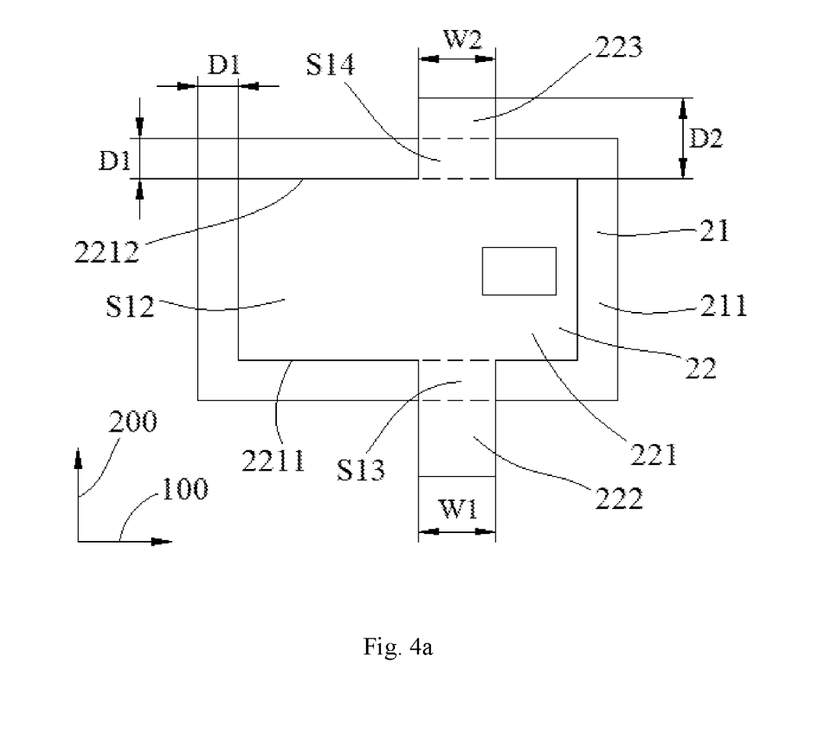
FIGS. 4a, 4b, and 4c show changing of an overlapping region between a second electrode and a first electrode when the second electrode faces directly to, moves downwards, and moves upwards respectively relative to the first electrode according to embodiment 1 of the present disclosure.

FIG. 4a schematically shows a structure of a storage capacitor of a pixel unit according to the present embodiment. The storage capacitor of the pixel unit comprises a first electrode 21 arranged on a first metal layer and a second electrode 22 arranged on a second metal layer. At the same time, an insulation layer is arranged between the first electrode 21 and the second electrode 22. FIG. 4a schematically shows the structure of the storage capacitor when observing along a normal line direction of an array substrate. It can be seen from FIG. 4a that, the first electrode 21 comprises a first region 211, and the second electrode 22 comprises a second region 221, a third region 222, and a fourth region 223. During manufacturing of the array substrate, an alignment accuracy between the first electrode 21 and the second electrode 22 in one pixel unit is different from that in another pixel unit. FIG. 4a schematically shows the structure of the storage capacitor when the second electrode 22 faces directly to the first electrode 21. At this time, the alignment accuracy between the second electrode 22 and the first electrode 21 meets an ideal situation. In the ideal situation, a center of the second region 221 and a center of the first region 211 coincide with each other, and a distance between a peripheral edge of the first region 211 and a peripheral edge of the second region 221 is a first distance D1. During specific implementation procedure, the first distance D1 is preferably selected as a maximum error of the alignment accuracy. At this time, the first distance D1 is also a preset distance of permit deviation during design.

Here, it is assumed that a direction of a first edge 2211 of the second region 221 is a first direction 100, and a direction perpendicular to the first direction 100 is a second direction 200.

As shown in FIG. 4a, the third region 222 is arranged at the first edge 2211 of the second region 221, extends to the outside part of the second region 221 along the second direction 200, and is connected to a drain electrode (not shown in FIG. 4a) that is also arranged on the second metal layer. It is obvious that, the third region 222 protrudes from the first region 211. Here, it is assumed that the third region 222 has a first width W1 along the first direction 100.

A second edge 2212 of the second region 221 is arranged parallel to the first edge 2211. A fourth region 223 is arranged at the second edge 2212 and extends to the outside part of the second region 221 along the second direction 200. Preferably, a width W2 of the fourth region 223 along the first direction 100 is equal to the first width W1.

At this time, an area of a first overlapping region between the first electrode 21 and the second electrode 22 includes a second overlapping area S12 between the second region 221 and the first region 211, a third overlapping area S13 between the third region 222 and the first region 211, and a fourth overlapping area S14 between the fourth region 223 and the first region 211. That is, the area of the first overlapping region is a sum S12+S13+S14 of the second overlapping area S12, the third overlapping area S13, and the fourth overlapping area S14.

As stated in the background of the invention, during manufacturing of the array substrate, there will be alignment accuracy difference among different regions, and a relative position between the second electrode and the first electrode in one region will be different from that in another region. With respect to a small sized panel, due to existence of the drain electrode, the area of the first overlapping region of one pixel unit will be different from that of another pixel unit. According to the present embodiment, the second electrode is provided with the fourth region 223, and thus it can be ensured that the area of the first overlapping region does not change when a deviation of the second electrode relative to the first electrode is within the preset distance. The specific situation of the first overlapping region will be illustrated below when the second electrode moves relative to the first electrode along the second direction 200.

Figure 4B:
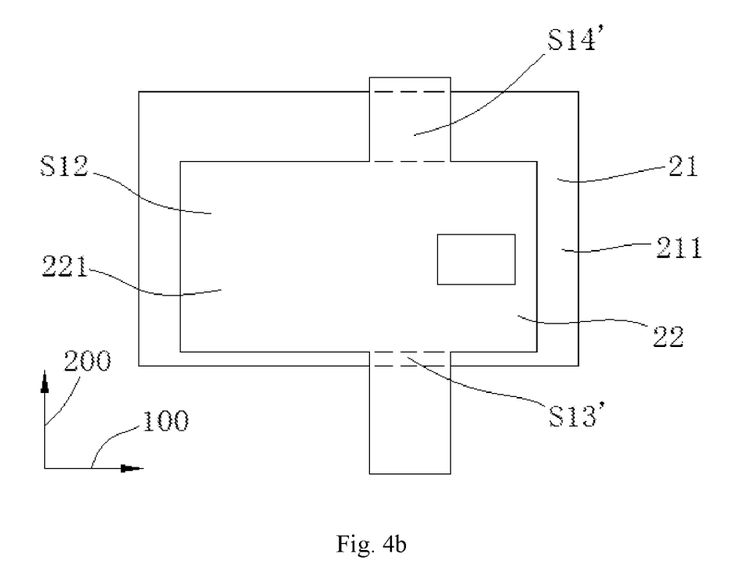

As shown in FIG. 4b, the second electrode 22 moves downwards relative to the first electrode 21 along the second direction 200. At this time, the area of the first overlapping region is S12+S13'+S14'. Since a deviation amount is less than the preset first distance D1, the second region 221 is always inside the first region 211, and the second overlapping area S12 does not change. However, a third overlapping area S13' is reduced compared with the third overlapping area S13 as shown in FIG. 4a, while a fourth overlapping area S14' is increased compared with the fourth overlapping area S14 as shown in FIG. 4a. Therefore, influence of the changing of the third overlapping area on the area of the first overlapping region can be offset by the changing of the fourth overlapping area. In particular, when W2 is equal to W1, the influence of the changing of the third overlapping area on the area of the first overlapping region can be offset by the changing of the fourth overlapping area to a largest extent, and thus the area of the first overlapping region as shown in FIG. 4b is consistent with the area of the first overlapping region as shown in FIG. 4a. In this manner, the storage capacitor difference among different regions generated by the alignment accuracy difference thereof can be eliminated, and the watermark which would be generated otherwise can be eliminated as well.

Figure 4C:
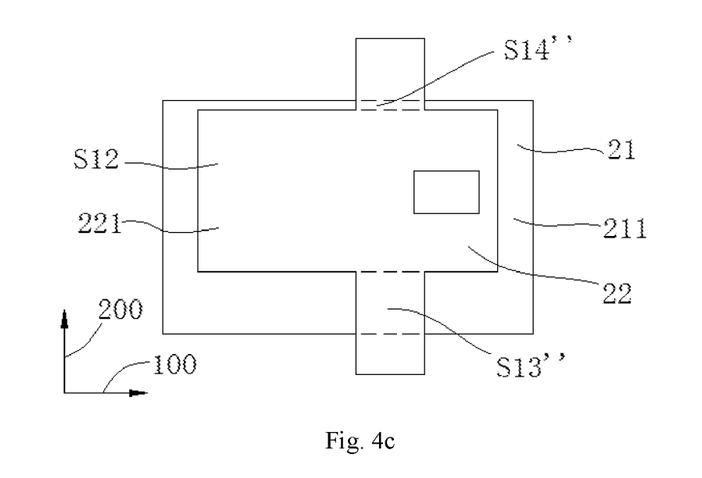

As shown in FIG. 4c, the second electrode 22 moves upwards relative to the first electrode 21 along the second direction 200. At this time, the area of the first overlapping region is S12+S13"+S14". Since a deviation amount is less than the preset first distance D1, the second overlapping area S12 does not change. Different from the situation as shown in FIG. 4b, a third overlapping area S13" is increased compared with the third overlapping area S13 as shown in FIG. 4a, while a fourth overlapping area S14" is reduced compared with the fourth overlapping area S14 as shown in FIG. 4a. Therefore, influence of the changing of the third overlapping area on the area of the first overlapping region can be offset by the changing of the fourth overlapping area. In particular, when W2 is equal to W1, the influence of the changing of the third overlapping area on the area of the first overlapping region can be offset by the changing of the fourth overlapping area to a largest extent, and thus the area of the first overlapping region as shown in FIG. 4c is consistent with the area of the first overlapping region as shown in FIG. 4a. In this manner, the storage capacitor difference among different regions generated by the alignment accuracy difference thereof can be eliminated, and the watermark which would be generated otherwise can be eliminated as well.

Preferably, as shown in FIG. 4a, a length D2 of the fourth region 223 along the second direction 200 is equal to or larger than twice the first distance D1. In this manner, no matter the second electrode 22 moves downwards or upwards relative to the first electrode 21 along the second direction 200, a changing amount of the fourth overlapping area S14 along the second direction is always equal to a changing amount of the third overlapping area S13 along the second direction as long as the deviation amount is within D1. Therefore, the area of the first overlapping region can be maintained unchanged. Hence, the storage capacitor difference among different regions generated by the alignment accuracy difference thereof can be eliminated, and the watermark which would be generated otherwise can be eliminated as well.

In particular, when the fourth region 223 and the third region 222 are arranged opposite to each other, as long as the deviation amount is less than the preset distance, the area of the first overlapping region not only can be maintained unchanged, but also is not affected by a shape of peripheral edges of the first region 211 and the second region 221.

Embodiment 2

Figure 5:
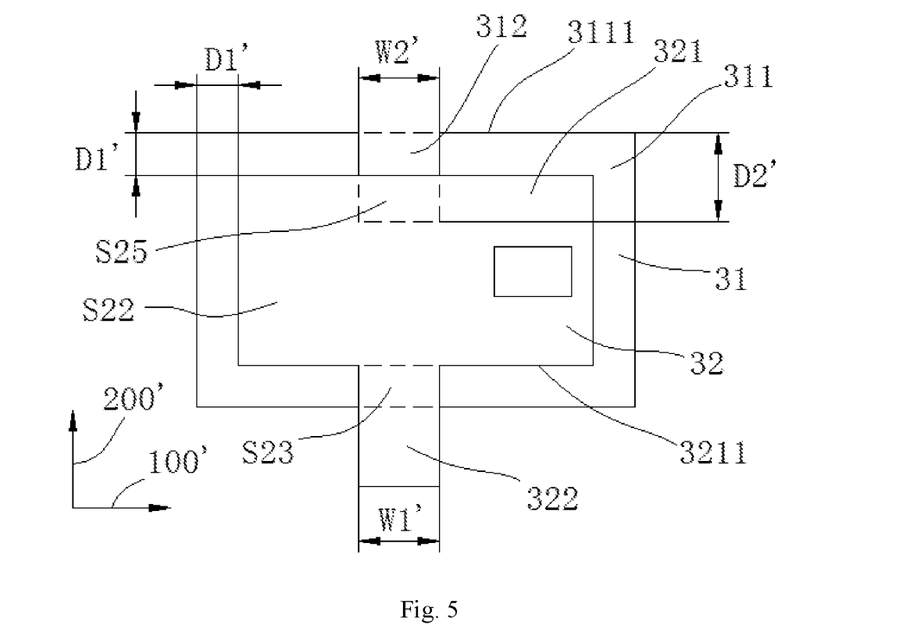
FIGS. 5, 6, and 7 show changing of an overlapping region between a second electrode and a first electrode when the second electrode faces directly to, moves downwards, and moves upwards respectively relative to the first electrode according to embodiment 2 of the present disclosure.

FIG. 5 schematically shows a structure of a storage capacitor of a pixel unit according to the present embodiment. Similar to that in embodiment 1, the storage capacitor of the pixel unit comprises a first electrode 31 arranged on a first metal layer and a second electrode 32 arranged on a second metal layer. At the same time, an insulation layer is arranged between the first electrode 31 and the second electrode 32. FIG. 5 schematically shows the structure of the storage capacitor when observing along a normal line direction of an array substrate. It can be seen from FIG. 5 that, the first electrode 31 comprises a first region 311 and a blank region 312, and no metal is arranged in the blank region 312. The second electrode 32 comprises a second region 321 and a third region 322. During manufacturing of the array substrate, an alignment accuracy between the first electrode 31 and the second electrode 32 in one pixel unit is different from that in another pixel unit. FIG. 5 schematically shows the structure of the storage capacitor when the second electrode 32 faces directly to the first electrode 31. At this time, the alignment accuracy between the second electrode 32 and the first electrode 31 meets an ideal situation. In the ideal situation, a center of the second region 321 and a center of the first region 311 coincide with each other, and a peripheral edge of the first region 311 deviates a first distance D1' to an outside part of the second region 321 relative to a peripheral edge of the second region 321. During specific implementation procedure, the first distance D1' is preferably selected as a maximum error of the alignment accuracy. At this time, the first distance D1' is also a preset distance of permit deviation during design.

Here, it is assumed that a direction of a first edge 3211 of the second region 321 is a first direction 100', and a direction perpendicular to the first direction 100' is a second direction 200'.

As shown in FIG. 5, the third region 322 is arranged at the first edge 3211 of the second region 321, extends to the outside part of the second region 321 along the second direction 200', and is connected to a drain electrode (not shown in FIG. 5) that is also arranged on the second metal layer. It is obvious that, the third region 322 protrudes from the first region 311. Here, it is assumed that the third region 322 has a first width W1' along the first direction 100'.

A third edge 3111 of the first region 311 is arranged parallel to and opposite to the first edge 3211 of the second region 321. The blank region 312 is arranged at the third edge 3111 and extends to an inside part of the first region 311 along the second direction 200'. Preferably, a width W2' of the blank region 312 along the first direction 100' is equal to the first width W1'.

At this time, an area of a first overlapping region between the first electrode 31 and the second electrode 32 is equal to a value obtained by subtracting a blank overlapping area S25 formed by the blank region 312 and the second region 321 from a sum of a second overlapping area S22 between the second region 321 and the first region 311 and a third overlapping area S23 between the third region 322 and the first region 311. That is, the area of the first overlapping region is S22+S23-S25.

Similar to embodiment 1, according to the present embodiment, the specific situation of the area of the first overlapping region will be illustrated below when the second electrode moves relative to the first electrode along the second direction 200'.

Figure 6:
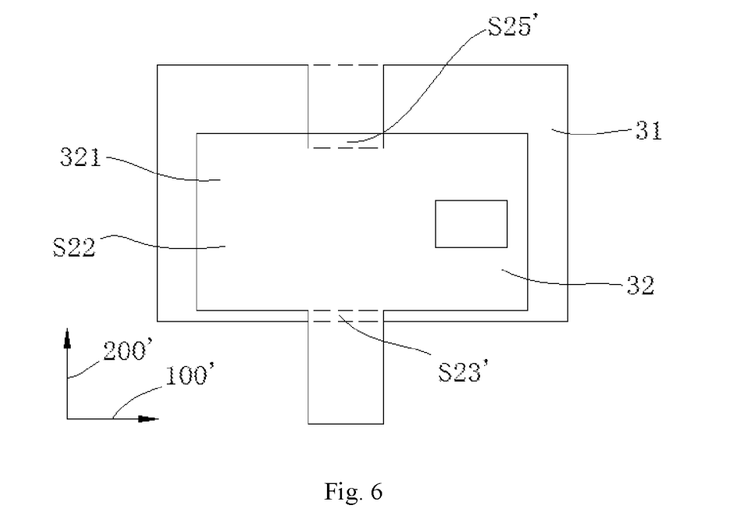

As shown in FIG. 6, the second electrode 32 moves downwards relative to the first electrode 31 along the second direction 200'. At this time, the area of the first overlapping region is S22'+S23'-S25'. Since a deviation amount is less than the preset first distance D1', the second region 321 is always inside the first region 311, and the second overlapping area S22' does not change. However, a third overlapping area S23' is reduced compared with the third overlapping area S23 as shown in FIG. 5, and a blank overlapping area S25' is also reduced compared with the blank overlapping area S25 as shown in FIG. 5. Therefore, changing amount of S22'+S23'-S25' can be reduced, and influence of alignment accuracy difference among different pixel units on the area of the first overlapping region can be reduced. In particular, when W2' is equal to W1', the influence of alignment accuracy difference among different pixel units on the area of the first overlapping region can be reduced to a largest extent, and thus the area of the first overlapping region as shown in FIG. 6 is consistent with the area of the first overlapping region as shown in FIG. 5. In this manner, the storage capacitor difference among different regions generated by the alignment accuracy difference thereof can be eliminated, and the watermark which would be generated otherwise can be eliminated as well.

Figure 7:
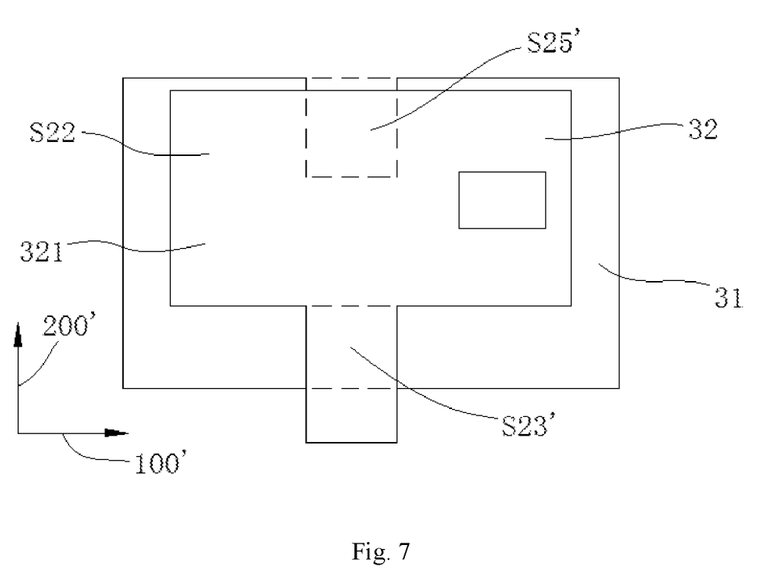

As shown in FIG. 7, the second electrode 32 moves upwards relative to the first electrode 31 along the second direction 200'. At this time, the area of the first overlapping region is S22"+S23"-S25". Since a deviation amount is less than the preset first distance D1', the second overlapping area S22" does not change. Different from that as shown in FIG. 6, a third overlapping area S23" is increased compared with the third overlapping area S23 as shown in FIG. 5, and a blank overlapping area S25" is also increased compared with the blank overlapping area S25 as shown in FIG. 5. Therefore, changing amount of S22"+S23"-S25" can be reduced, and influence of alignment accuracy difference among different pixel units on the area of the first overlapping region can be reduced. In particular, when W2' is equal to W1', the influence of alignment accuracy difference among different pixel units on the area of the first overlapping region can be reduced to a largest extent, and thus the area of the first overlapping region as shown in FIG. 7 is consistent with the area of the first overlapping region as shown in FIG. 5. In this manner, the storage capacitor difference among different regions generated by the alignment accuracy difference thereof can be eliminated, and the watermark which would be generated otherwise can be eliminated as well.

Preferably, as shown in FIG. 5, a length D2' of the blank region 312 along the second direction 200' is equal to or larger than twice the first distance D1'. In this manner, no matter the second electrode 32 moves downwards or upwards relative to the first electrode 31 along the second direction 200', a changing amount of the blank overlapping area along the second direction is always equal to a changing amount of the third overlapping area along the second direction as long as the deviation amount is within D1'. Therefore, the area of the first overlapping region can be maintained unchanged. Hence, the storage capacitor difference among different regions generated by the alignment accuracy difference thereof can be eliminated, and the watermark which would be generated otherwise can be eliminated as well.

In particular, when a central line of the blank region along the second direction and a central line of the third region along the second direction coincide with each other, the area of the first overlapping region not only can be maintained unchanged, but also is not affected by a shape of peripheral edges of the first region 311 and the second region 321.

The present disclosure further provides an array substrate, which comprises the storage capacitor of the pixel unit according to embodiment 1 or 2. The storage capacitor difference among different pixel units generated by the alignment accuracy difference thereof can be eliminated, and the watermark which would be generated otherwise can be eliminated as well. A uniform display of a panel can be ensured, and a quality of a product can be improved.

At last, it should be noted that, the above embodiments are only used for illustrating, rather than restricting the present disclosure. The present disclosure is illustrated in detail in combination with preferred embodiments hereinabove, but it can be understood that, the embodiments disclosed herein can be amended or substituted without departing from the protection scope of the present disclosure. In particular, as long as there are no structural conflicts, the technical features disclosed in each and every embodiment of the present disclosure can be combined with one another in any way, and the combined features formed thereby are within the protection scope of the present disclosure.

The invention claimed is:

1. A pixel unit, comprising a storage capacitor that is arranged on an array substrate,
    wherein the storage capacitor comprises a first electrode arranged on a first metal layer and a second electrode arranged on a second metal layer;
    wherein an insulation layer is arranged between the first electrode and the second electrode; and
    wherein the second electrode and the first electrode overlap with each other to form a first overlapping region,
    wherein the first electrode comprises a first region, the second electrode comprises a second region, a third region and a fourth region,
    wherein the third region is arranged at a first edge of the second region and has a first width along a first direction,
    wherein the fourth region is arranged at a second edge of the second region opposite to the first edge and has a second width along the first direction,
    wherein the second width is equal to the first width,
    wherein when a center of the second region and a center of the first region coincide with each other, a first peripheral edge of the first region deviates a first distance outside of the second region relative to a first peripheral edge of the second region along the first direction, a second peripheral edge of the first region deviates a second distance outside of the second region relative to a second peripheral edge of the second region along a second direction perpendicular to the first direction, the third region extends outside of the first region along the second direction, and the fourth region extends outside of the first region along the second direction,
    wherein the third region is a first protrusion of the second electrode that protrudes from the second region and the fourth region is a second protrusion of the second electrode that protrudes form the second region, wherein the first and second protrusion have a smaller width than the second region,
    wherein the first width is less than a third width of the second region along the first direction,
    wherein the third region is directly electrically connected to a drain electrode.

2. The pixel unit according to claim 1, wherein the second edge is parallel to the first edge.

3. The pixel unit according to claim 1, wherein the fourth region is arranged opposite to the third region.

4. The pixel unit according to claim 1, wherein a length of the fourth region along the second direction is equal to or larger than twice the second distance, a length of the third region along the second direction is equal to or larger than twice the second distance.

5. The pixel unit according to claim 1, wherein the first direction is a direction of the first edge, and the second direction is a deviation direction of the second electrode relative to the first electrode.

6. The pixel unit according to claim 1, wherein the first distance is equal to the second distance.

7. The pixel unit according to claim 6, wherein the second electrode and the drain electrode are on the same metal layer.

8. An array substrate, comprising a pixel unit, which comprises a storage capacitor that is arranged on the array substrate,
    wherein the storage capacitor comprises a first electrode arranged on a first metal layer and a second electrode arranged on a second metal layer;
    wherein an insulation layer is arranged between the first electrode and the second electrode; and
    wherein the second electrode and the first electrode overlap with each other to form a first overlapping region, wherein the first electrode comprises a first region, the second electrode comprises a second region, a third region and a fourth region,
    wherein the third region is arranged at a first edge of the second region and has a first width along a first direction,
    wherein the fourth region is arranged at a second edge of the second region opposite to the first edge and has a second width along the first direction,
    wherein the second width is equal to the first width,
    wherein when a center of the second region and a center of the first region coincide with each other, a first peripheral edge of the first region deviates a first distance outside of the second region relative to a first peripheral edge of the second region along the first direction, a second peripheral edge of the first region deviates a second distance outside of the second region relative to a second peripheral edge of the second region along a second direction perpendicular to the first direction, the third region extends outside of the first region along the second direction, and the fourth region extends outside of the first region along the second direction,
    wherein the third region is a first protrusion of the second electrode that protrudes from the second region and the fourth region is a second protrusion of the second electrode that protrudes form the second region, wherein the first and second protrusion have a smaller width than the second region,
    wherein the first width is less than a third width of the second region along the first direction,
    wherein the third region is directly electrically connected to a drain electrode.

9. The array substrate according to claim 8, wherein the second edge is parallel to the first edge.

10. The array substrate according to claim 8, wherein the fourth region is arranged opposite to the third region.

11. The array substrate according to claim 8, wherein the first direction is a direction of the first edge, and the second direction is a deviation direction of the second electrode relative to the first electrode.

* * * * *